(12) United States Patent
Holder

(10) Patent No.: US 6,749,683 B2
(45) Date of Patent: *Jun. 15, 2004

(54) PROCESS FOR PRODUCING A SILICON MELT

(75) Inventor: John D. Holder, Lake St. Louis, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 163 days.

This patent is subject to a terminal disclaimer.

(21) Appl. No.: 10/036,875

(22) Filed: Oct. 23, 2001

(65) Prior Publication Data

US 2002/0083887 A1 Jul. 4, 2002

Related U.S. Application Data

(63) Continuation-in-part of application No. 09/943,600, filed on Aug. 30, 2001, which is a continuation of application No. 09/503,566, filed on Feb. 14, 2000, now Pat. No. 6,344,083.

(51) Int. Cl.[7] .............................................. C30B 15/20
(52) U.S. Cl. ........................... 117/15; 117/13; 117/35; 117/532
(58) Field of Search .................. 117/13, 15, 932, 117/35

(56) References Cited

U.S. PATENT DOCUMENTS

| | | |
|---|---|---|
| 4,249,988 A | 2/1981 | Lavigna et al. |
| 4,591,409 A | 5/1986 | Ziem et al. |
| 4,705,591 A | 11/1987 | Carle et al. |
| 5,373,805 A | 12/1994 | Takano et al. |
| 5,588,993 A | 12/1996 | Holder |
| 5,676,751 A | 10/1997 | Banan et al. |
| 5,725,660 A | 3/1998 | Hiraishi |
| 5,814,148 A | 9/1998 | Kim et al. |
| 5,913,975 A | 6/1999 | Holder |
| 5,919,303 A | 7/1999 | Holder |
| 5,976,247 A | 11/1999 | Hansen et al. |
| 5,980,629 A | 11/1999 | Hansen et al. |
| 6,344,083 B1 * | 2/2002 | Holder ........................ 117/13 |

FOREIGN PATENT DOCUMENTS

| | | |
|---|---|---|
| EP | 61127697 | 6/1986 |
| EP | 942077 | 9/1998 |
| FR | 2038156 | 1/1971 |
| JP | 5294780 | 9/1993 |

OTHER PUBLICATIONS

International Search Report, PCT/US01/03460 Jul. 25, 2001.

* cited by examiner

*Primary Examiner*—Robert Kunemund
(74) *Attorney, Agent, or Firm*—Senniger, Powers, Leavitt & Roedel

(57) ABSTRACT

A process for controlling the amount of insoluble gas trapped by a silicon melt is disclosed. Polycrystalline silicon is charged to a crucible in a crystal pulling apparatus and the apparatus sealed and evacuated. After evacuation, the crystal pulling apparatus is backfilled at least once with a gas having a high solubility in silicon, such as nitrogen. The highly soluble gas fills in cavities between the polycrystalline silicon pieces and between the pieces and the crucible such that when the silicon is melted and bubbles form in the molten silicon the bubbles will solubilize into the melt instead of becoming entrapped in the growing crystal.

30 Claims, 1 Drawing Sheet

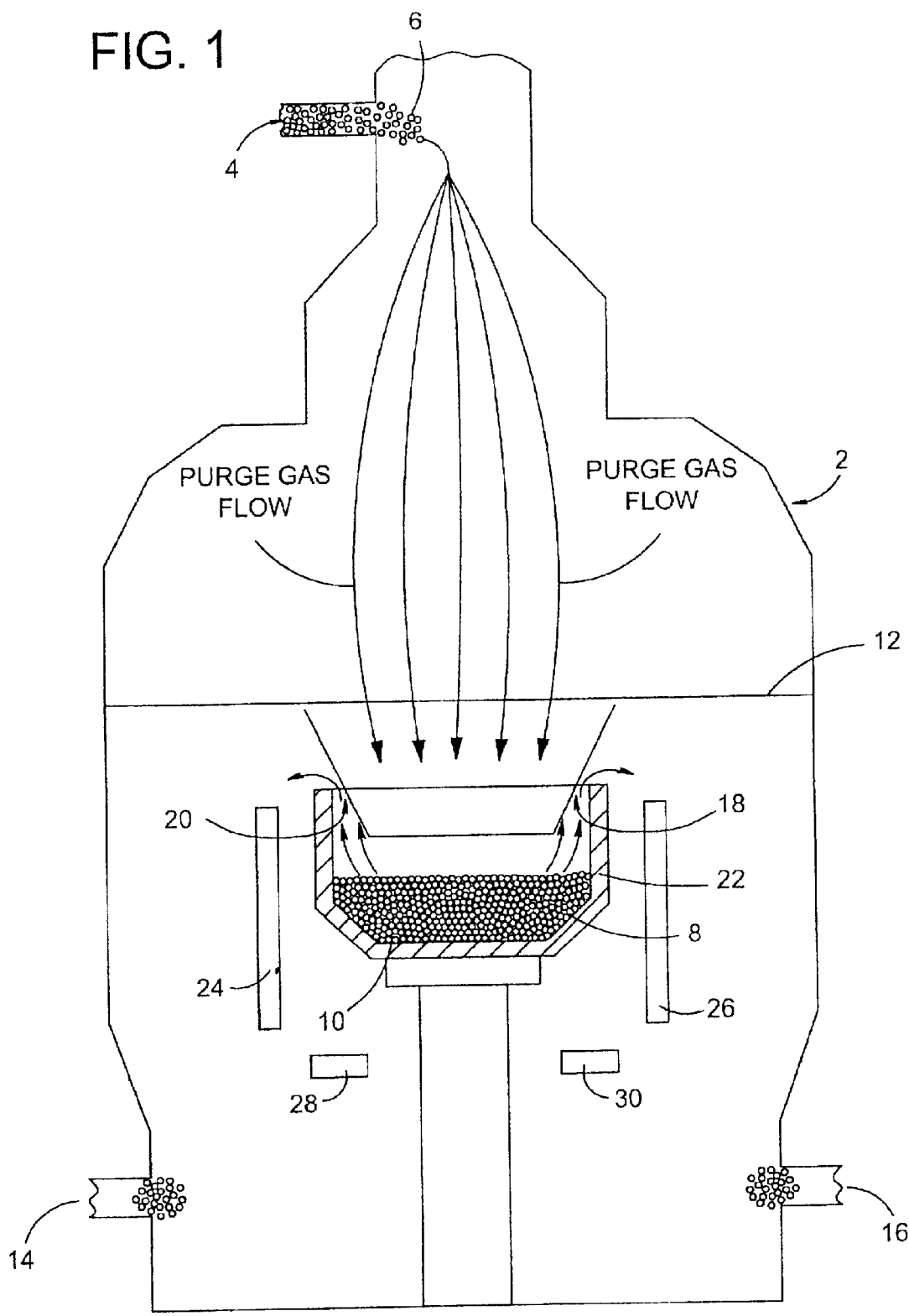

PROCESS FOR PRODUCING A SILICON MELT

This patent application is a Continuation-In-Part patent application which claims priority from U.S. patent application Ser. No. 09/943,600 filed on Aug. 30, 2001, which is a continuation of U.S. patent application Ser. No. 09/503,566 filed on Feb. 14, 2000 is now 6,344,083.

BACKGROUND OF THE INVENTION

The present invention relates to a process for producing single crystal ingots having a reduced amount of crystal defects. More particularly, the present invention relates to a process for producing a silicon melt for growing single crystal silicon ingots wherein the silicon melt contains a very low amount of gases insoluble in silicon.

In the production of single silicon crystals grown by the conventional Czochralski method, polycrystalline silicon in the form of granular polysilicon, chunk polysilicon, or a mixture of chunk and granular polysilicon is first introduced into a quartz crucible in a crystal pulling apparatus. Chunk polysilicon is a polycrystalline silicon mass which is generally irregular in shape, with sharp, jagged edges as a result of the fact that it is prepared by breaking rods of polycrystalline silicon into smaller pieces; chunk polysilicon typically ranges from about 2 centimeters to about 10 centimeters in length and from about 4 centimeters to about 6 centimeters in width. Granular polysilicon is a polycrystalline silicon mass that is generally smaller, more uniform and smoother than chunk polysilicon as a result of the fact that it is typically prepared by chemical vapor deposition of silicon onto a silicon granule in a fluidized bed reactor; granular polysilicon typically ranges from about 1–5 millimeters in diameter and generally has a packing density which is about 20% higher than chunk polysilicon.

After the loading of the polysilicon, the apparatus is sealed and evacuated using a vacuum pump apparatus to a pressure of about 100 millitorr to remove the ambient air surrounding the crucible. It is generally desirable to evacuate the crystal pulling apparatus prior to heating and melting the polycrystalline silicon to remove moisture and oxygen from within the crystal pulling apparatus to prevent reaction with molten polysilicon. Reactions between moisture and molten polysilicon and/or oxygen and molten polysilicon can produce silicon oxide gas that can condense and accumulate on the furnace tank and hot zone parts in the crystal pulling apparatus. During subsequent crystal growth, this oxide condensate can detach from the furnace tank and/or hot zone parts and fall into the melt resulting in serious defects in the growing crystal making many of the resulting wafers unsuitable for use.

After the ambient air is substantially evacuated from the crystal puller, the vacuum system is typically turned off and the crystal puller is backfilled with a gas which is substantially non-reactive with silicon. Conventionally, argon, which is highly insoluble in silicon, has been utilized. Argon is typically backfilled into the crystal pulling apparatus to achieve a pressure of about 100 Torr. After backfilling, the vacuum system is again engaged and the argon gas is substantially evacuated to achieve a pressure of about 1 Torr. This backfilling and evacuation procedure may be repeated several times to ensure that substantially all of the ambient air is removed from the crystal pulling apparatus.

Following the final evacuation, argon is backfilled in the crystal puller to achieve a pressure of typically from about 10 Torr to about 30 Torr and the pumping and argon flow system are adjusted for pressure and flow conditions for an argon purge utilized during silicon heating and melting and ingot growth. Typical argon purges may be at a pressure of about 15 Torr and a flow of about 50 slm to about 100 slm.

After the evacuation and backfilling procedures are complete, the polysilicon is melted down and equilibrated at a temperature of about 1450° C. As the polysilicon is heated and melted, the argon purge gas is continuously introduced over the crucible and silicon to remove unwanted contaminants from the melt area that are produced in and around the melt during the melting of the polysilicon. After the silicon has completely melted and reached a temperature of about 1450° C., a seed crystal is dipped into the melt and subsequently extracted while the crucible is rotated to form a single crystal silicon ingot.

During the addition of the chunk and/or granular polysilicon to the quartz crucible, small cavities are created between the polysilicon pieces themselves and between the polysilicon pieces and the crucible bottom and sidewalls. After the ambient air is removed by vacuum from the crystal puller, the backfilled argon gas replaces the ambient air in these cavities. Consequently, when the polysilicon is melted, the argon gas that filled the cavities vacated by the ambient air forms insoluble gas bubbles in the melt. Many of these gas bubbles comprised of argon will remain attached to the crucible bottom and/or sidewalls for many hours during the crystal growing process. Additionally, during the early stages of the melting process when the polycrystalline charge is completely or partially in the solid state, the argon purge gas may become trapped in the above-described cavities in the polysilicon charge.

While the problem of trapped gases occurs with all charge types including chunk silicon, granulated polycrystalline silicon, and mixtures thereof, the problem is particularly acute with charges formed from only granulated polycrystalline silicon; the granular polysilicon with its high packing density tends to increase trapping of gas at the bottom and side walls of the crucible. Because argon is highly insoluble in silicon, trapped argon gas in the melt forms small bubbles in the liquid silicon during melting. Many of the insoluble gas bubbles contained in the liquid melt rise to the surface or are carried to the surface by convection and are released into the crystal growth gas ambient and thus have no detrimental effect on the growing ingot. As mentioned above, however, a smaller number of the gas bubbles remain in the liquid melt on or at the crucible bottom or sidewalls throughout the pulling process and when released are grown into the crystal itself during growth. These bubbles, comprised of argon backfilled or argon purge gas, become trapped at the liquid-solid growth interface and cause large crystal voids on the crystal surface. Such defects are generally characterized and detected on sliced silicon wafers as large pits generally having a diameter of greater than about 50 or 100 micrometers. These pits are identified through laser scanning of polished wafers cut from the grown crystal. Such defects can effect 4% or more of wafers sliced from grown crystals and cause these slices to be unfit for grade one wafer product.

As such, a need exists in the semiconductor industry for a process of preparing a silicon melt for growing a single silicon crystal wherein the silicon melt contains a very low amount of gases insoluble in silicon such that a resulting silicon crystal can be grown substantially free of large pits.

SUMMARY OF THE INVENTION

Among the objects of the present invention, therefore, are the provision of a process for preparing a silicon melt containing a very low level of gases insoluble in silicon; the provision of a process for preparing a single silicon crystal containing a very low level of large crystal voids; the provision of a process for producing a silicon melt which produces a high percentage of grade one wafers; the provision of a simple, cost-effective process which reduces the number of defects in a grown single silicon crystal; and the provision of a process for preparing a silicon melt in which substantially all of the gas trapped in the silicon charge during the melting process is soluble in silicon.

The present invention, therefore, is directed to a process for controlling the amount of insoluble gas trapped by a silicon melt. The process comprises charging a crucible in a crystal pulling apparatus with polycrystalline silicon and sealing and evacuating the apparatus. Finally, the apparatus is backfilled with a gas selected from the group consisting of nitrogen and hydrogen.

The present invention is further directed to a process for controlling the amount of insoluble gas trapped by a silicon melt. The process comprises charging a crucible in a crystal pulling apparatus with polycrystalline silicon and sealing and evacuating the apparatus. The apparatus is then backfilled with a gas selected from the group consisting of nitrogen and hydrogen and then evacuated again. Finally, the apparatus is again backfilled with a gas selected from the group consisting of nitrogen and hydrogen.

Other objects and features of this invention will be in part apparent and in part pointed out hereinafter.

BRIEF DESCRIPTION OF THE DRAWINGS

FIG. 1 is a schematic diagram of the flow pattern of a purging gas during the melting of a polycrystalline silicon charge in a crystal pulling apparatus.

Corresponding reference characters indicate corresponding parts throughout the drawings.

DETAILED DESCRIPTION OF THE PREFERRED EMBODIMENTS

Surprisingly, it has been discovered that large crystal voids which form in silicon single crystals during a Czochralski growth process as a result of the trapping of insoluble gases such as argon in the growing crystal can be significantly reduced in number or even eliminated by controlling the composition of any gases occupying the void spaces between chunks or granules of polysilicon in a crucible before a molten mass of silicon is formed in the crucible. As used herein, the term "insoluble gas" or "gases insoluble in silicon" refers to gases that will remain as a bubble (i.e., not dissolve) in molten silicon for an extended period of time of at least about 10 hours. One specific example of such an insoluble gas is argon.

In the process of the present invention, polycrystalline silicon in the form of granular polysilicon, chunk polysilicon, or a mixture of chunk and granular polysilicon is loaded into a quartz crucible in a crystal pulling apparatus. Because of the irregular shape of the chunk polysilicon and the generally spherical shape of the granular polysilicon, the loaded crucible contains voids or cavities between the polysilicon pieces (i.e., polysilicon granules, polysilicon chunks, or a mixture of granular and chunk polysilicon) and between the polysilicon pieces and the sidewall and bottom of the crucible. Initially, these voids or cavities are filled with ambient air.

After the crucible is loaded with polysilicon and the crucible is inserted into the crystal pulling apparatus, the apparatus is sealed and evacuated using a vacuum pump to remove gases trapped in the crucible (i.e., ambient air trapped in voids between the pieces of polysilicon and between the pieces of polysilicon pieces and the crucible wall and bottom). As a practical matter, however, a complete vacuum cannot be achieved and thus, not all of the gases trapped in the crucible can be removed. In addition, the amount of gas trapped in the crucible which can be removed by pulling a vacuum is a function of the packing density of the pieces of polysilicon in the crucible and the vacuum pressure; in general, as packing density increases, lower pressures are required to remove gases trapped in the crucible.

In a conventional process, the evacuated crystal puller would be backfilled with the process gas to be used in the crystal pulling operation, e.g., argon, to a pressure of about 100 Torr. To insure that ambient air is substantially replaced, this process of evacuation and backfilling with the process gas would typically be repeated one or more times. As a result, the process gas would surround the crucible and fill the voids between the pieces of polysilicon and between the polysilicon and the crucible walls and melt.

In the process of the present invention, however, the crystal pulling apparatus is backfilled with nitrogen, hydrogen, or another gas substantially soluble in silicon rather than argon or another gas which is substantially insoluble in silicon. Preferably, the backfilling gas has a mole fraction of a gas substantially soluble in silicon such as nitrogen or hydrogen of at least about 0.5, more preferably at least about 0.6, more preferably at least about 0.7, more preferably at least about 0.8, more preferably at least about 0.9, and still more preferably about 1. Because a complete vacuum cannot be achieved, all of the gases trapped in the crucible cannot be removed in a single cycle of evacuation and backfilling. The amount of insoluble gas trapped between the pieces of polysilicon after one cycle of evacuation and backfilling, however, can be further reduced by repeating the evacuation and backfilling (with a soluble gas) steps once, twice, three times, or more. As a result, a substantial amount of the gas occupying the voids between the pieces of polysilicon and between the pieces of polysilicon and the crucible wall and bottom will dissolve into the silicon melt and disappear rather than form large insoluble bubbles which can ultimately be grown into the crystal.

In general, the final composition of the gas filling the voids between the pieces of polysilicon and between the pieces of polysilicon and the sidewall and bottom of the crucible is a function of the pressure achieved in the evacuation step(s), the pressure achieved in the backfilling step(s), the number of cycles of evacuation and backfilling, and the composition of the backfill gas. Preferably, however, the crystal puller is evacuated to a pressure of no more than 700 millitorr, more preferably no more than about 500 millitorr, and still more preferably no more than about 100 millitorr, and still more preferably no more than about 50 millitorr to remove the ambient air trapped in the crucible. Preferably, the evacuated crystal pulling apparatus will be back-filled with soluble gas to a pressure of at least about 10 Torr, more preferably at least about 30 Torr, and still more preferably at least about 100 Torr. In one embodiment, the process of evacuation and backfilling is repeated once, twice or even three or more times. Regardless of the number of cycles of evacuation and backfilling or even the pressure achieved in any previous backfilling step, if more than one, in the final (only, if there is not more than one) backfilling step the crystal pulling chamber is preferably backfilled with soluble gas to the pressure that will be utilized during the polycrystalline silicon heating and melting and ingot growth. Typically, this process pressure is about 15 to about 30 Torr.

As a result of the evacuation and backfilling steps, the backfill gas, which is substantially soluble in silicon, displaces and replaces a substantial amount of the ambient air or insoluble gas in the cavities between the polysilicon pieces and between the polysilicon pieces and the crucible walls and/or bottom. A single evacuation/backfill cycle in accordance with the present invention results in a significant dilution of the ambient air and insoluble gas in the crystal puller environment and in the cavities between the polysilicon pieces and between the polysilicon pieces and the crucible walls and/or bottom such that a substantial amount of the ambient air and insoluble gas in the crystal pulling apparatus and in the crucible is displaced and replaced with gas soluble in silicon. Although the process of the present invention is highly useful utilizing only a single evacuation/backfill process as a substantial amount of ambient air and gas insoluble in silicon is displaced and replaced with a gas soluble in silicon due to gaseous dilution, as mentioned above the evacuation/backfill procedure can be repeated one or more times to further reduce the amount of ambient air and any insoluble gas from the crucible and increase introduction of soluble gas. When the crystal pulling apparatus is evacuated and backfilled more than once, the ambient air and insoluble gas is diluted again and again resulting in a decreased concentration of ambient air and insoluble gas in the crystal puller after each successive dilution. Through multiple or serial dilutions, the amount of ambient air and insoluble gas contained in the crystal pulling apparatus and cavities can be reduced to an extremely low level in accordance with the present invention. As such, after the final backfill with a gas soluble in silicon, the gas filling the crystal pulling apparatus and the cavities between the polysilicon pieces and the polysilicon pieces and the crucible walls is substantially comprised of a gas soluble in silicon as a substantial amount, if not almost 100% of the insoluble gas has been displaced and replaced with soluble gas.

One skilled in the art will recognize that although the amount of insoluble gas in the crystal puller can never be reduced to zero, as the number of evacuation/backfill procedures increases, the amount of ambient air and insoluble gas in the crucible will typically decrease because of the dilution effect. Although a process incorporating several evacuation/backfill procedures is within the scope of the present invention, typically the benefit of additional evacuation/backfill procedures substantially decreases after about three or four procedures such that the cost of the procedure and the time involved may outweigh any additional benefits obtained by numerous repeated evacuation/backfill procedures. Generally, no more than about two evacuation/backfill procedures are preferred. Typically, after only one or two evacuation/backfill procedures, any insoluble gas that is still contained in the crucible in the crystal puller is present in such a small amount that the bubbles formed upon the melting of the silicon charge are so small that even if they are ultimately grown into the crystal they are substantially non-detectable and non-problematic.

By replacing a substantial amount of argon, the conventional backfilling gas, with a gas substantially soluble in silicon such as nitrogen, any bubbles that ultimately form in the melting or molten polysilicon due to gasses trapped in the cavities dissolve directly into the molten polysilicon and cannot be incorporated into the growing crystal as voids as the bubbles disappear from the melt. As such, instead of having argon filled bubbles grown into the growing ingot, the ingot is grown without the incorporation of bubbles as any bubbles in the molten silicon are comprised of a soluble gas and are dissolved into the molten silicon before the crystal is grown.

After the evacuation and backfilling procedure(s) are complete and the cavities present between the polycrystalline silicon pieces themselves and the pieces and crucible are substantially filled with a gas substantially soluble in silicon such as nitrogen, heat is applied to the crucible and surrounding area and the polycrystalline silicon charge melting process is initiated. As the polysilicon charge is heated and melted to form molten silicon which is ultimately formed into a single silicon crystal, a purge gas is typically directed into and around the crucible. FIG. 1 shows the flow pattern of purge gas inside a crystal pulling apparatus 2 during the heating and melting of the polycrystalline silicon. Purge gas 6 enters the crystal pulling apparatus 2 through purge gas inlet 4 and flows down into the crucible 8 which contains polysilicon charge 10 through purge tube 12. Crucible 8 is supported by support structure 22 and heated by heaters 24, 26, 28, and 30. Purge tube 12 directs purge gas directly into crucible 8 and polycrystalline charge 10. The purge gas 6 has a Laminar flow pattern throughout the crystal pulling apparatus 2 and crucible 8 and carries contaminants produced during the melting of the polycrystalline charge away from the crucible area. Purge gas 6 exits crucible 8 containing polycrystalline charge 10 through open areas 18 and 20 and exits the crystal pulling apparatus 2 through purge gas outlets 14 and 16. The flow rates of the purge gases are generally set to achieve a pressure above the crucible of between about 1 and about 40 Torr, more preferably between about 10 and about 30 Torr, and most preferably about 25 Torr. A suitable flow rate of a purge gas may be, for example, from about 50 slm to about 100 slm.

In accordance with one embodiment of the present invention, the purge gas utilized in and around the crucible during the heating and melting of the polycrystalline silicon may be substantially or completely comprised of a conventional purge gas such as argon. Although conventional purge gasses such as argon are highly insoluble in silicon and can become trapped as bubbles in the growing ingot if present in the silicon melt, utilizing argon as a purge gas during the heating and melting of polycrystalline silicon is not substantially problematic with the present invention. Because the cavities present in the polycrystalline silicon in the crucible are filled with a gas which is substantially soluble in silicon during the backfilling procedure(s) prior to the heating and melting of the polycrystalline silicon, it is very difficult for the argon atoms to penetrate into the cavities, displace the soluble gas atoms, and replace them with insoluble gas. Typically, argon, because of its comparatively large atomic diameter, will be very slow to exchange with a gas substantially soluble in silicon located in cavities in the polycrystalline silicon or in bubbles in the forming melt. As such, the insoluble gas in the cavities which ultimately leads to bubbles in the melt along with bubbles already present in the melt will be substantially eliminated and dissolved into the melt prior to the incorporation of a substantial amount of insoluble argon gas. For example, if nitrogen is used as the backfill gas, any resultant bubbles in the molten silicon will dissolve into the silicon very quickly, typically on the order of only seconds. Once the cavities and bubbles are dissolved into the melt, it is highly unlikely that argon will be capable of dissolving into the melt to form insoluble bubbles as argon is substantially insoluble in silicon.

In accordance with a preferred embodiment of the present invention, the purge gas utilized during the polycrystalline silicon heating and melting process may be solely or partially comprised of a gas having a relatively high solubility in molten silicon. Preferably, the purge gas comprises a gas having a solubility in molten silicon of at least about $1\times10^{13}$ atoms/cm$^3$, more preferably at least about $1\times10^{14}$ atoms/cm$^3$, more preferably at least about $1\times10^{15}$ atoms/cm$^3$, still more preferably at least about $1\times10^{16}$ atoms/cm$^3$, still more preferably at least about $1\times10^{17}$ atoms/cm$^3$, and most preferably at least about $6\times10^{18}$ atoms/cm$^3$ to ensure sufficient solubility of the gas into the silicon melt. Such gases include, for example, nitrogen, chlorine, and helium, hydrogen. Nitrogen, with a solubility in silicon of about $6\times10^{18}$ atoms/cm$^3$ and hydrogen, with a solubility in silicon of about $1.7\times10^{19}$ atoms/cm$^3$, are particularly preferred. Compound gases having the desired solubility such as $CO_2$, $NH_3$ or HCl are also within the scope of the present invention. All of the gasses described herein are substantially more soluble in silicon than argon, which is believed to have a solubility in silicon of nearly zero, and certainly less than about $1\times10^5$ atoms/cm$^3$.

The purge gas may comprise a single gas or a mixture of soluble gases, or a mixture of argon and a soluble gas; if a mixture of argon and a soluble gas is used, it is generally preferred that the mole fraction of the soluble gas in the purge gas mixture be at least 0.2, 0.4, 0.5, or even 0.6. More preferably, the mole fraction of insoluble gas in the purge gas mixture is at least 0.7, 0.8, 0.9, or even about 1. Thus, for example, the purge gas may comprise a mixture of argon and nitrogen (and/or other gases having a high solubility in silicon). Regardless of the gases selected, the source gases preferably have a purity of at least about 99%, more preferably at least about 99.9%, and most preferably at least about 99.99%.

For purposes of the present invention, the polycrystalline charge melting step of a crystal growing process may be considered to comprise two phases: the heating phase and the melting phase. The heating phase of the melting process comprises the time period before molten silicon has formed in the crucible, including the time period before any heat is applied to the crucible, and the melting phase of the charge melting process comprises the time period from the formation of the first molten silicon until the polycrystalline silicon charge is completely molten.

In accordance with the preferred embodiment of the present invention, the purge gas comprises a gas having a high solubility in molten silicon during at least a part of the heating phase of the melting step of a crystal growing process. The heating phase of the charge melting step (i.e., before any molten silicon has formed in the crucible) is the stage at which the trapping of gas between polysilicon particles or at the sidewall formation or bottom may be problematic; during this stage, the purge gas may displace some of the substantially soluble gas in the cavities trapped between polysilicon particles or along the sidewall formation or bottom of the crucible. As previously noted, insoluble purge gases trapped in these locations may inadvertently become incorporated into the growing crystal; soluble gases, however, will tend to dissolve into the melt thereby eliminating the bubble before it can become incorporated as such into the growing crystal. The use of purge gases having a high solubility in silicon during the heating phase thus significantly reduces or eliminates the likelihood that any displacement of gas soluble in silicon and replacement with argon will occur. Thus, the probability of gas pockets being grown into the growing ingot is substantially reduced. For at least a fraction of the heating phase, therefore, it is preferred that the mole fraction of gas(es) having a high solubility in molten silicon in the purge gas be at least 0.2, 0.4, 0.5, or even 0.6. More preferably, the mole fraction of gas(es) having a high solubility in molten silicon in the purge gas is at least 0.7, 0.8, 0.9, or even about 1 for at least 20%, 40%, 80%, or even 100% of the heating phase; that is, before molten silicon has formed in the crucible.

As the charge melting process continues, the melting phase begins and molten silicon is formed in the crucible and a layer of molten silicon begins to collect and grow along the bottom and sidewalls of the crucible. As more silicon continues to melt, the level of molten silicon in the center of the crucible grows. During this time period, the trapping of purge gas in the melt becomes less problematic as insoluble gases are less likely to be trapped between the crucible sidewalls or bottom and solid polysilicon particles. Also, insoluble gas trapping between polysilicon particles themselves becomes less problematic as the polysilicon charge becomes completely molten as the solid polysilicon particles remaining in the melt become wetted by the liquid silicon making it difficult for insoluble gas to penetrate between the particles and become trapped. Consequently, the benefit of including a gas having a high solubility in molten silicon in the purge gas decreases. Nevertheless, some benefit may be realized by including a gas having a high solubility in molten silicon in the purge gas during the melting phase, i.e., the phase between the point in time at which some molten silicon is formed in the crucible and the point in time at which the polysilicon charge is fully melted. For at least a fraction of this melting phase and preferably until at least the bottom of the crucible is covered by a layer of molten silicon, the mole fraction of gas(es) having a high solubility in molten silicon in the purge gas is preferably at least 0.2, 0.4, 0.4 or even 0.6. More preferably, the mole fraction of gas(es) having a high solubility in molten silicon in the purge gas is at least 0.7, 0.8, 0.9, or even about 1 for at least 5%, 10%, 20%, 40%, 80%, or even 100% of the melting phase of the charge melting process.

When the melting phase of the charge melting step of a crystal growing process is complete and the polysilicon charge is fully melted, no further purge gas can become trapped between the polysilicon charge and the crucible sidewalls or bottom, or between the polysilicon charge particles themselves. At this point, the purge gas can be switched to a conventional argon purge or other purge, without significant concern as to the purge gas solubility in silicon. If the preferred nitrogen purge gas is used during the heating and/or melting phases of the charge melting process, after the polycrystalline charge has fully melted and become molten it is generally preferred that the purge gas be switched to argon or another purge gas to control the amount of nitrogen dissolved in the melt. In one embodiment of the present invention, preferably no more than about $5\times10^{12}$ nitrogen atoms/cm$^3$ are dissolved into the liquid melt during the heating and melting of the polycrystalline charge. An excess incorporation of nitrogen into the molten silicon can lead to the formation of solid nitride particles which may make it difficult to grow dislocation free crystals.

In another embodiment of the present invention a soluble purge gas such as nitrogen can be used during the heating and melting of the charge melting step of a crystal growing process and during crystal growth to incorporate at least $1\times10^{10}$ atoms/cm$^3$, more preferably at least $5\times10^{13}$ atoms/cm$^3$, or more, into the growing crystal. The nitrogen doped crystal is then sliced into silicon wafers and subsequently processed by chamfering, lapping, etching, polishing or similar conventional processes to produce finished silicon wafers. After processing, the wafer is subjected to a heat treatment through the use of a rapid heating/rapid cooling apparatus to out-diffuse oxygen and nitrogen in the surface layers to eliminate defects in the wafer. This process is known in the art and fully set forth in EPO Patent No. 0942077.

Silicon melts prepared in accordance with the present invention utilizing a backfilling process including a gas substantially soluble in silicon and a purging gas which has a high solubility in silicon for a period of time during charge melting contain a significantly reduced amount of insoluble gas as compared to melts prepared with the conventional argon purge. In certain circumstances, as much as 4% of silicon wafers sliced from single silicon crystals grown from conventionally prepared melts have at least 1 large pit making them unsuitable for grade one product. As such, for every 1000 silicon wafers produced from conventionally prepared melts about 40 are not useable as grade one product. Silicon wafers sliced from single silicon crystals grown from melts prepared in accordance with the present invention are substantially free from large pits. As used herein, the term "substantially free from large pits" means that the resulting number of wafers containing at least one large pit is reduced by at least 50%, more preferably at least 90%, and most preferably 100% from the number of pits on wafers produced from a silicon melt using the conventional argon purging gas for the entire melting process. As such, for each 1000 silicon wafers sliced from ingots grown from the silicon melts of the present invention, at least 20 more wafers, preferably at least 36 more, and most preferably 40 more wafers are useable as grade one product. The resulting wafers are substantially free from large pits as the amount of insoluble gases trapped in the melt and transferred into the growing ingot is significantly reduced or eliminated through the use of the melt of the present invention. Therefore, a much larger percentage of wafers sliced from the single crystal will be suitable for grade one material.

In accordance with the present invention, the silicon melt prepared using the backfilling process and soluble purging gas during the melting of the polysilicon may be used in combination with the quartz crucible disclosed by Holder in U.S. Pat. No. 5,913,975. The crucible described in U.S. Pat. No. 5,913,975 is prepared by fusing the crucible in an atmosphere such as synthetic air which contains a very low level of argon. As such, the fused crucible is not a significant contributor of insoluble gases into the silicon melt during the melting of the polycrystalline silicon. The combination of the silicon melt of the present invention and the crucible disclosed by Holder in U.S. No. Pat. 5,913,975 may lead to a further reduction of gases insoluble in silicon being incorporated into a growing silicon ingot and, hence, the production of more grade 1 wafers per grown crystal.

The present invention is illustrated by the following example which is merely for the purpose of illustration and is not to be regarded as limiting the scope of the invention or manner in which it may be practiced.

EXAMPLE

In this Example two separate 32 kilogram silicon charges comprised of 100% granular polysilicon were each melted in a 14 inch diameter crucible in a Kayex-Hamco 3000 furnace and single crystal silicon ingots grown therefrom. To increase the probability of the formation of bubbles from insoluble gases, each crucible was coated on the inside side walls and bottom with a barium carbonate devitrification promoter. The silicon ingots were subsequently sliced into individual silicon wafers which were single side polished and inspected for large pits.

The first 32 kilogram charge of granular polysilicon was melted under a conventional argon purge flowing at a rate of about 32 slm and a pressure of about 25 Torr. The polysilicon was melted and allowed to equilibrate at a temperature of about 1500° C. The melting and equilibration process took about 3.5 hours. After the polysilicon had equilibrated, a 120 mm diameter crystal was grown to a length of about 1200 mm on the first attempt. The crystal was subsequently sliced and ground into 100 mm wafers which were single side polished and inspected by laser scanning on a Model CR 80 Laser Scanner (A.D. Optical) for large surface pits greater than 10 micrometers in diameter. The laser scanning determined that 3.2% of the polished silicon wafers had one or more pits having a diameter equal to or greater than 10 micrometers at the polished surface.

The second 32 kilogram charge of granular polysilicon was melted under a nitrogen purge at a flow rate of about 52 slm and a pressure of about 25 Torr for about 1 hour until there was a continuous layer of liquid polysilicon in contact with the sidewalls and bottom of the crucible. After about 1 hour, the purge was switched to a conventional argon purge at a flow rate of about 32 slm and a pressure of about 25 Torr. The polysilicon was completely melted and allowed to equilibrate at a temperature of about 1500° C. The melting and equilibration process took about 3.5 hours. After the polysilicon had equilibrated, a 120 mm diameter crystal was grown to a length of 1200 mm on the first attempt. The crystal was subsequently sliced and ground into 100 mm wafers which were single side polished and inspected by laser scanning on a Model CR 80 Laser Scanner (A.D. Optical) for large surface pits greater than 10 micrometers in diameter. The laser scanning determined that 0.7% of the polished silicon wafers had one or more pits having a diameter equal to or greater than 10 micrometers at the polished surface.

The results of this experiment show that the silicon wafers sliced from the single crystal produced from the melt prepared utilizing a purge gas having a high solubility in silicon had about 80% fewer large pits on the polished surface.

In view of the above, it will be seen that the several objects of the invention are achieved.

As various changes could be made in the above-described melt preparation process without departing from the scope of the invention, it is intended that all matter contained in the above description be interpreted as illustrative and not in a limiting sense.

What is claimed is:

1. A process for controlling the amount of insoluble gas trapped in a mass of molten silicon contained within a crucible having a sidewall formation and a bottom, the process comprising:
   (a) loading pieces of polysilicon into the crucible, the loaded crucible containing cavities between adjacent pieces of polysilicon and between pieces of polysilicon and the sidewall formation and the bottom of the crucible, the cavities being filled with a gas,
   (b) placing the loaded crucible into a crystal pulling apparatus;
   (c) sealing the crystal pulling apparatus after the loaded crucible has been placed therein;
   (d) evacuating gas from the sealed crystal pulling apparatus to reduce the pressure within the crystal puller and to reduce the amount of gas occupying the cavities; and
   (e) backfilling the evacuated crystal pulling apparatus with a backfill gas to increase the pressure within the crystal puller and to increase the amount of gas occupying the cavities, said backfill gas having a mole fraction of at least about 0.5 of a gas selected from the group consisting of hydrogen and nitrogen.

2. The process as set forth in claim 1 wherein steps (d) and (e) are repeated at least once.

3. The process as set forth in claim 1 wherein steps (d) and (e) are repeated at least twice.

4. The process as set forth in claim 1 wherein the backfill gas has a mole fraction of at least about 0.6.

5. The process as set forth in claim 1 wherein the backfill gas has a mole fraction of at least about 0.7.

6. The process as set forth in claim 1 wherein the backfill gas has a mole fraction of at least about 0.8.

7. The process as set forth in claim 1 wherein the backfill gas has a mole fraction of at least about 0.9.

8. The process as set forth in claim 1 wherein the backfill gas has a mole fraction of about 1.

9. The process as set forth in claim 1 wherein the backfill gas has a mole fraction of at least about 0.5 of nitrogen.

10. The process as set forth in claim 1 wherein the backfill gas has a mole fraction of about 1 of nitrogen.

11. The process as set forth in claim 1 wherein the pressure is reduced in step (d) to a pressure of no more than about 700 millitorr.

12. The process as set forth in claim 1 wherein the pressure is reduced in step (d) to a pressure of no more than about 500 millitorr.

13. The process as set forth in claim 1 wherein the pressure is reduced in step (d) to a pressure of no more than about 100 millitorr.

14. The process as set forth in claim 1 wherein the pressure is reduced in step (d) to a pressure of no more than about 50 millitorr.

15. The process as set forth in claim 1 wherein the pressure in the backfilled evacuated crystal pulling apparatus after step (e) is about 100 Torr.

16. A process for controlling the amount of insoluble gas trapped in a mass of molten silicon contained within a crucible having a sidewall formation and a bottom, the process comprising:

(a) loading pieces of polysilicon into the crucible, the loaded crucible containing cavities between adjacent pieces of polysilicon and between pieces of polysilicon and the sidewall formation and the bottom of the crucible, the cavities being filled with a gas;

(b) placing the loaded crucible into a crystal pulling apparatus;

(c) sealing the crystal pulling apparatus after the loaded crucible has been placed therein;

(d) evacuating gas from the sealed crystal pulling apparatus to reduce the pressure within the crystal puller; and (e) backfilling the evacuated crystal pulling apparatus with a backfill gas to increase the pressure within the crystal puller before a mass of molten silicon is formed in the crucible, said backfill gas having a mole fraction of at least about 0.5 of a gas selected from the group consisting of hydrogen and nitrogen.

17. The process as set forth in claim 16 wherein steps (d) and (e) are repeated at least once.

18. The process as set forth in claim 16 wherein steps (d) and (e) are repeated at least twice.

19. The process as set forth in claim 16 wherein the backfill gas has a mole fraction of at least about 0.6.

20. The process as set forth in claim 16 wherein the backfill gas has a mole fraction of at least about 0.7.

21. The process as set forth in claim 16 wherein the backfill gas has a mole fraction of at least about 0.8.

22. The process as set forth in claim 16 wherein the backfill gas has a mole fraction of at least about 0.9.

23. The process as set forth in claim 16 wherein the backfill gas has a mole fraction of about 1.

24. The process as set forth in claim 16 wherein the backfill gas has a mole fraction of at least about 0.5 nitrogen.

25. The process as set forth in claim 16 wherein the backfill gas has a mole fraction of about 1 of nitrogen.

26. The process as set forth in claim 16 wherein the pressure is reduced in step (d) to a pressure of no more than about 700 millitorr.

27. The process as set forth in claim 16 wherein the pressure is reduced in step (d) to a pressure of no more than about 500 millitorr.

28. The process as set forth in claim 16 wherein the pressure is reduced in step (d) to a pressure of no more than about 100 millitorr.

29. The process as set forth in claim 16 wherein the pressure is reduced in step (d) to a pressure of no more than about 50 millitorr.

30. The process as set forth in claim 16 wherein the pressure in the backfilled evacuated crystal pulling apparatus after step (e) is about 100 Torr.

* * * * *